US010306787B2

(12) United States Patent
Kang et al.

(10) Patent No.: US 10,306,787 B2
(45) Date of Patent: May 28, 2019

(54) DISPLAY DEVICE

(71) Applicant: LG ELECTRONICS INC., Seoul (KR)

(72) Inventors: Seunggyu Kang, Seoul (KR); Chulki Kim, Seoul (KR); Seokhun Na, Seoul (KR); Jaeuk Ryu, Seoul (KR); Woohyuk Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/805,358

(22) Filed: Nov. 7, 2017

(65) Prior Publication Data
US 2019/0098779 A1 Mar. 28, 2019

(30) Foreign Application Priority Data
Sep. 25, 2017 (KR) ........................ 10-2017-0123624

(51) Int. Cl.
*G06F 1/16* (2006.01)
*H05K 5/02* (2006.01)
*H05K 5/03* (2006.01)
*H05K 5/00* (2006.01)

(52) U.S. Cl.
CPC ......... *H05K 5/0217* (2013.01); *H05K 5/0017* (2013.01); *H05K 5/03* (2013.01)

(58) Field of Classification Search
CPC ...... H05K 5/0217; H05K 5/0017; H05K 5/03; G06F 1/1681
See application file for complete search history.

(56) References Cited

U.S. PATENT DOCUMENTS

| 8,199,471 | B2* | 6/2012 | Bemelmans | G09F 9/00 345/690 |
| 9,519,313 | B2* | 12/2016 | Kim | G06F 1/166 |
| 2014/0226266 | A1 | 8/2014 | Kang et al. | |
| 2015/0023030 | A1 | 1/2015 | Tsukamoto | |
| 2015/0043136 | A1* | 2/2015 | Kim | G02F 1/133305 361/679.01 |
| 2015/0103474 | A1* | 4/2015 | Cho | B29C 39/12 361/679.01 |
| 2015/0250315 | A1* | 9/2015 | Gross | F16M 11/10 361/679.01 |
| 2015/0261255 | A1* | 9/2015 | Takeuchi | G06F 1/1626 345/173 |
| 2015/0296641 | A1* | 10/2015 | Song | H05K 5/0217 361/679.01 |
| 2015/0373865 | A1* | 12/2015 | Byeon | H05K 5/0017 361/679.01 |

(Continued)

FOREIGN PATENT DOCUMENTS
KR 10-2017-0015820 A 2/2017

*Primary Examiner* — Hoa C Nguyen
*Assistant Examiner* — Christopher L Augustin
(74) *Attorney, Agent, or Firm* — Birch, Stewart, Kolasch & Birch, LLP

(57) ABSTRACT

A display device including a first supporter; a second supporter located opposite the first supporter; a display panel extending between the first supporter and the second supporter and extending to side parts of the first supporter and the second supporter; a third supporter; a fourth supporter located opposite to the third supporter; and a first pivotable strut bar pivotally connected to the first supporter and the second supporter.

16 Claims, 24 Drawing Sheets

(56) References Cited

U.S. PATENT DOCUMENTS

| | | | |
|---|---|---|---|
| 2016/0147327 A1 | 5/2016 | Choi et al. | |
| 2016/0218316 A1 | 7/2016 | Lee et al. | |
| 2016/0374228 A1* | 12/2016 | Park | G09F 9/301 |
| 2017/0193863 A1* | 7/2017 | Cho | H05K 5/0217 |
| 2017/0295655 A1* | 10/2017 | Jung | H05K 5/0017 |
| 2017/0318689 A1* | 11/2017 | Kim | G09F 9/301 |
| 2017/0359910 A1* | 12/2017 | Seo et al. | G06F 1/1652 |
| 2018/0063978 A1* | 3/2018 | Kim | H05K 5/0017 |

\* cited by examiner

DISPLAY DEVICE

This application claims the benefit of Korean Patent Application No. 10-2017-0123624 filed on Sep. 25, 2017, the entire contents of which are incorporated herein by reference for all purposes as if fully set forth herein.

BACKGROUND OF THE INVENTION

Field of the Invention

The present invention is related to a display device.

Discussion of the Related Art

As the information society develops, the demand for display devices is increasing in various forms. Recently, various display devices such as a liquid crystal display device (LCD), a plasma display panel (PDP), an electro luminescent display (ELD), a vacuum fluorescent display (VFD), and an organic light emitting diode (OLED) have been studied.

Among them, the OLED panel can display an image by depositing an organic layer capable of emitting light on a substrate on which a transparent electrode is formed. OLED panels are not only thin but also have flexible characteristics. Many studies have been made on the structural characteristics of a display device having such an OLED panel.

SUMMARY OF THE INVENTION

Accordingly, an object of the present disclosure is to address problems with related art display devices.

Another object of the present invention is to secure the structural rigidity of the display device.

Another object of the present invention is to prevent a bending of a display panel.

Still another object of the present invention is to enhance convenience for manufacturing a display device.

To achieve these and other advantages and in accordance with the purpose of the present invention, as embodied and broadly described herein, the present invention provides in one aspect a display device including a first supporter; a second supporter located opposite the first supporter; a display panel extending between the first supporter and the second supporter and extending to side parts of the first supporter and the second supporter; a third supporter; a fourth supporter located opposite to the third supporter; and a first pivotable strut bar pivotally connected to the first supporter and the second supporter.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
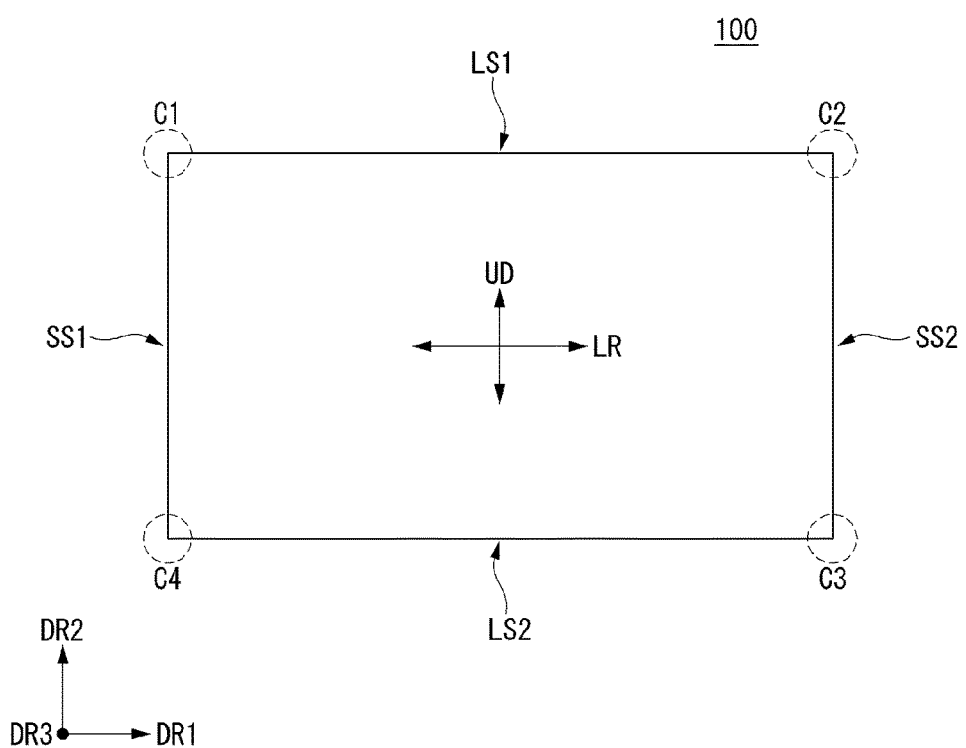
FIGS. 1 to 3 are views showing examples of a display panel according to an embodiment of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed. When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context. In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity. Hereinafter, an organic light emitting diode (OLED) will be described as an example of the display panel. However, the display panel applicable to the present invention is not limited to the OLED panel.

Referring to FIG. 1, a display device 100 includes a first long side LS1, a second long side LS2, a first short side SS1, and a second short side SS2. The second long side LS2 is opposite to the first long side LS1, and the second short side SS2 is opposite to the first short side SS1. In addition, the first short side SS1 is adjacent to the first long side LS1 and the second long side LS2.

A region adjacent to the first short side SS1 is a first short side region SS1. The first short side region SS1 may be referred to as a first side region. A region adjacent to the second short side SS2 is a second short side region SS2. The first short side region SS1 may be referred to as a second side region. A region adjacent to the first long side LS1 is a first long side region LS1. The first long side region LS1 may be referred to as a third side region. In addition, a region adjacent to the second long side LS2 is a second long side region LS2. The second long side region LS2 may be referred to as a fourth side region.

As shown in FIG. 1, the lengths of the first and second long sides LS1 and LS2 are longer than the lengths of the first and second short sides SS1 and SS2. However, it is also possible that the lengths of the first and second long sides LS1 and LS2 are substantially equal to the lengths of the first and second short sides SS1 and SS2.

The first direction DR1 is a direction parallel to the long side LS1 and LS2 of the display panel 100 and the second direction DR2 is a direction parallel to the short side SS1 and SS2 of the display panel 100. Further, the third direction DR3 is a direction perpendicular to the first direction DR1 and/or the second direction DR2.

In addition, a horizontal direction may refer to at least one of the first direction DR1 or the second direction DR2. The third direction DR3 can be referred to as a vertical direction. A side on which the display device 100 displays an image may be referred to as a 'forward direction', a 'frontward direction', a 'front side', or a 'front surface'. A side on which the display device 100 cannot observe the image can also be referred to as a 'backward direction', 'rearward direction', a 'back side', a 'rear side', a 'back surface', or a 'rear surface'.

When looking at the display device 100 from the front side of the display device, the first long side LS1 side may be referred to as an 'upper side' or an 'upper surface'. Likewise, the second long side LS2 may be referred to as a 'lower side' or 'a lower surface'. Similarly, the first short side SS1 may be referred to as a 'left side' or a 'left surface', and the second short side SS2 may be referred to as a 'right side' or a 'right surface'.

The first long side LS1, the second long side LS2, the first short side SS1 and the second short side SS2 may be referred to as an edge of the display device 100. A point where the first long side LS1, the second long side LS2, the first short side SS1, and the second short side SS2 meet with each other can be referred to as a corner. A point at which the first long side LS1 and the first short side SS1 meet each other may be referred to as a first corner C1. A point at which the first long side LS1 and the second short side SS2 meet each other may be referred to as a second corner C2. A point at which the second short side SS2 meets the second long side LS2 may be referred to as a third corner C3. A point at which the second long side LS2 meets the first short side SS1 may be referred to as a fourth corner C4.

A direction from the first short side SS1 to the second short side SS2 or a direction from the second short side SS2 to the first short side SS1 may be referred to as the left and right direction LR. A direction from the first long side LS1 to the second long side LS2 or a direction from the second long side LS2 to the first long side LS1 may be referred to as the up and down direction UD.

Figure 2:
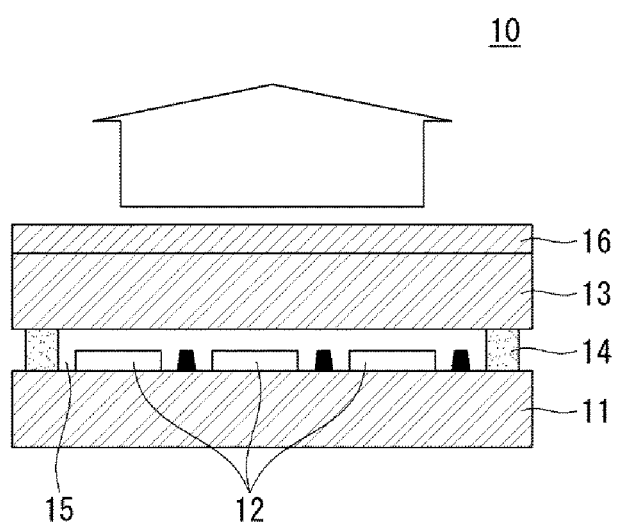

Referring to FIG. 2, an OLED (organic light emitting layer) 12 is applied or deposited on the first substrate 11. For example, the first substrate 11 may be glass, and a TFT may be formed on the first substrate 11. The second substrate 13 may be positioned on the first substrate 11 and the OLED 12. A spacer 14 or a sealant 14 may be positioned between the first substrate 11 and the second substrate 13. An encapsulant 15 may be formed between the first substrate 11 and the second substrate 13. The OLED 12 can be sealed by the encapsulant 15. For example, the second substrate 13 may be glass, and a color filter may be formed on the second substrate 13. In addition, the polarizing filter 16 may be positioned or formed on the second substrate 13. The display panel 10 having such a configuration can be flexible.

Figure 3:
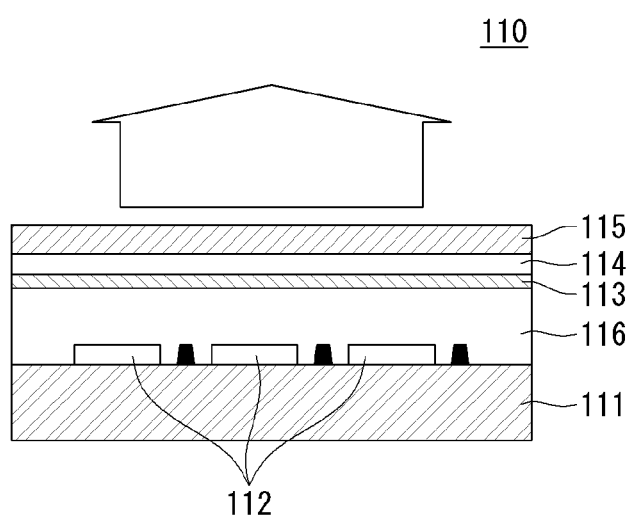

Referring to FIG. 3, the OLED 112 can be coated or deposited on the substrate 111. For example, the substrate 111 may be plastic, and a TFT can be formed on the substrate 111. Thin film layers 113 and 114 are located above the substrate 111 and the OLED 112. For example, the thin film layers 113 and 114 may be plastic. The thin film layers 113 and 114 may include a color filter. The polarizing filter 115 may be positioned or formed on the thin film layers 113 and 114. The OLED 112 can be sealed by the encapsulant 116. The display panel 110 having such a configuration can be easily bent or rolled.

Figure 4:
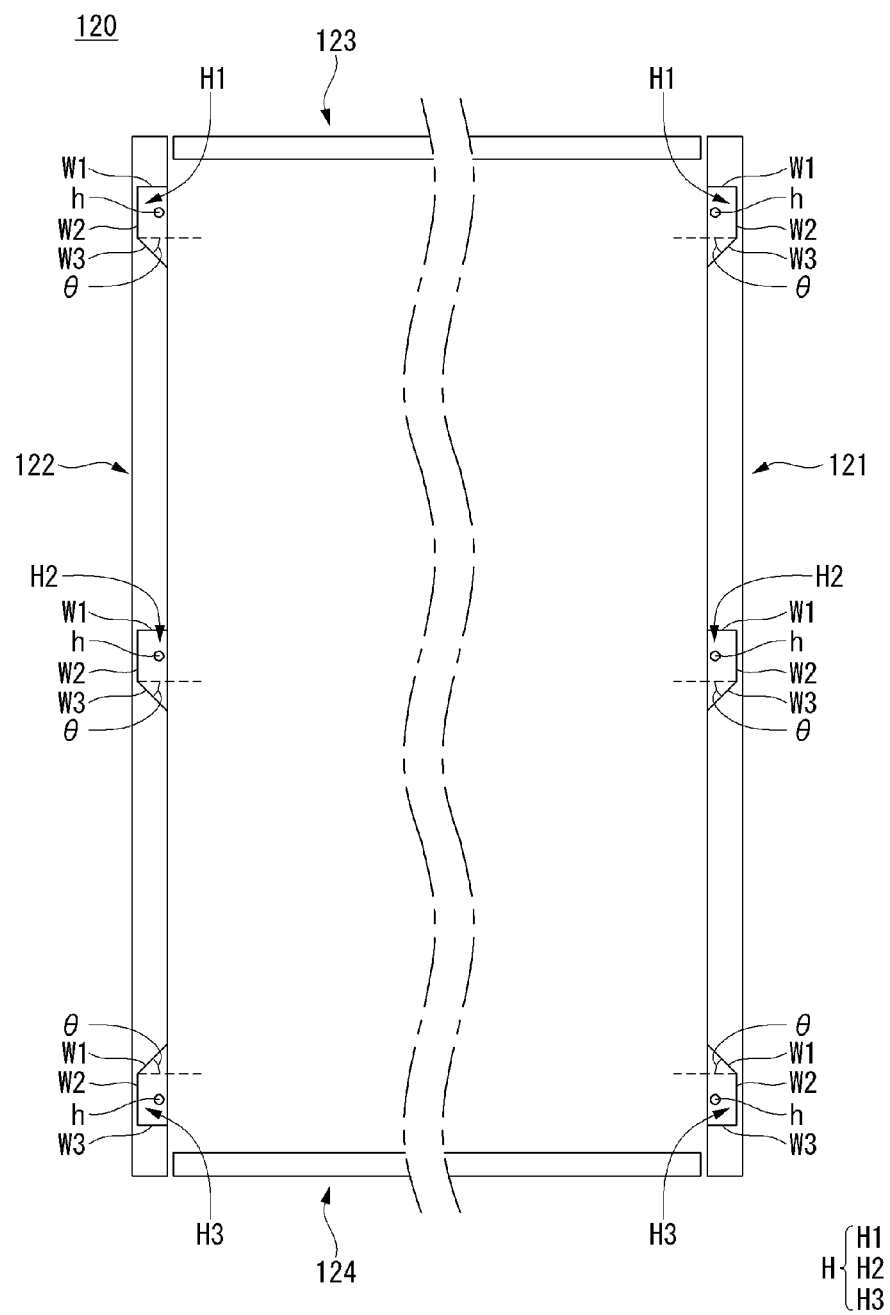
FIGS. 4 to 6 are views showing examples of the structure of a display device according to an embodiment of the present invention.
Figure 5:
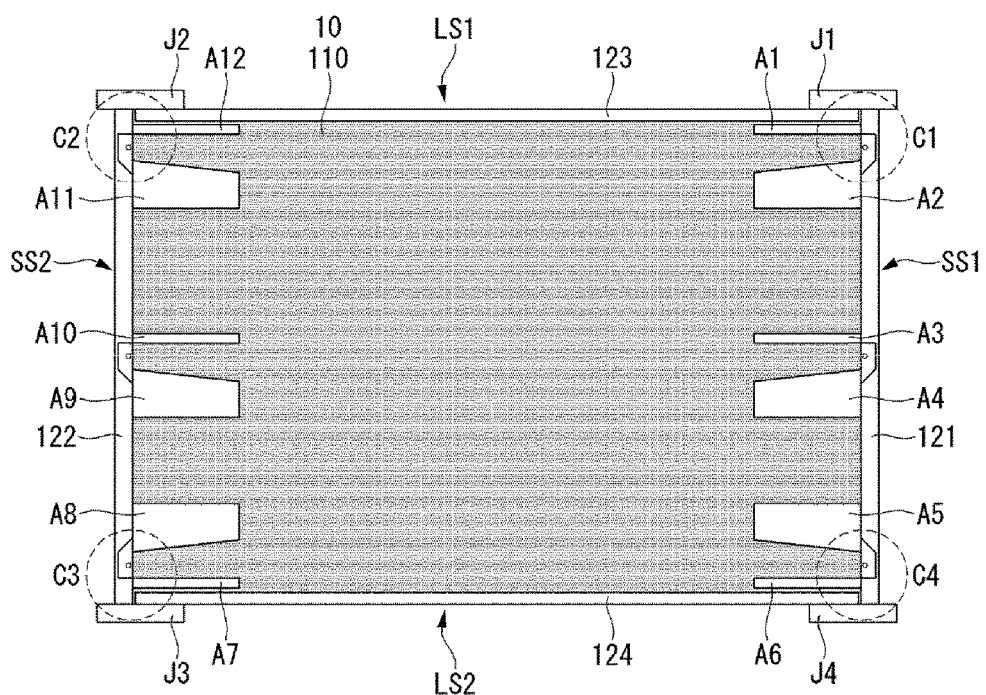

Referring to FIGS. 4 and 5, a bar 120 may be fixed to the rear surface of the display panel 10, 110. The bar 120 may be referred to as a rigid bar 120 or a supporter 120 or a frame 120. The bar 120 can also be provided in plural.

As shown, the first bar 121 is positioned adjacent to the first short side SS1 of the display panel 10, 110. Also, the second bar 122 is located adjacent the second short side SS2 of the display panel 10,110. The third bar 123 is located on the first long side LS1 of the display panel 10, 110. The fourth bar 124 is located on the second long side LS2 of the display panel 10, 110.

In addition, the first bar 121 is spaced apart from the third bar 123 and the fourth bar 124. The second bar 122 is spaced apart from the third bar 123 and the fourth bar 124. The clearance between the first to fourth bars 121 to 124 may be for providing tension to the display panel 10, 110. When the bars 121, 122, 123, and 124 are connected or coupled with each other, tension applied to the display panels 10 and 110 can reduced, and the flatness of the display panels 10 and 110 can be reduced.

As shown in FIG. 4, the first bar 121 and the second bar 122 may have a groove H. The description of the grooves H of the second bar 122 may be the same as the description of the grooves H of the first bar 121. In addition, the description of the grooves H of the first bar 121 can be in substitution for description of the grooves H of the second bar 122.

The grooves H can also be provided in plural. The groove H may be referred to as a coupling groove H or a coupling portion H. In addition, the first bar 121 may have a first groove H1, a second groove H2, and a third groove H3. The first groove H1 may be formed on the first bar 121 and be positioned adjacent to an end of the first bar 121. The third groove 113 may be formed on the first bar 121 and be positioned adjacent to another end of the first bar 121. Also, the second groove H2 may be formed on the first bar 121 and be positioned between the first groove H1 and the third groove H3. The first to third grooves H1 to H3 may be formed on a surface of the first bar 121. The first to third grooves H1 to H3 may also be positioned on the surface of the first bar 121. Each of the grooves H may have a hole h. The hole h may be referred to as a fastening hole h.

The second groove H2 may have the same shape as the first groove H1, and the third groove H3 may be symmetrical to the first groove H1 with respect to the second groove H2. The first groove H1 may have a first wall W1, a second wall W2, and a third wall W3. The first wall W1 may be formed in the width direction or the thickness direction of the first bar 121. The second wall W2 may be connected to the first wall W1 and may be formed in the longitudinal direction of the first bar 121. The third wall W3 may be connected to the second wall W2 and may be formed in the width or thickness direction of the first bar 121. The third wall W3 may be tilted with respect to the first wall W1 or the second wall W2. The first wall W1 may be closer to the end of the first bar 121 and the third wall W3 may be closer to the other end of the first bar 121. That is, the first groove H1 may have an opening angle θ toward the other end of the first bar 121 by the third wall W3. The end of the first bar 121 may be referred to as an upper end of the first bar 121. The other end of the first bar 121 may be referred to as a lower end of the first bar 121.

The third groove H3 can also have a first wall W1, a second wall W2, and a third wall W3. In more detail, the first wall W1 may be formed in the width direction or the thickness direction of the first bar 121. The second wall W2 may be connected to the first wall W1 and may be formed in the longitudinal direction of the first bar 121. Also, the third wall W3 may be connected to the second wall W2 and be formed in the width or thickness direction of the first bar 121. The first wall W1 can be inclined with respect to the second wall W2 or the third wall W3. In addition, the first wall W1 may be closer to the end of the first bar 121, and the third wall W3 may be closer to the other end of the first bar 121. That is, the third groove H3 can have an opening angle θ toward the end of the first bar 121 by the first wall W1.

As shown in FIG. 5, the jigs J1 to J4 can be positioned adjacent to the first corner C1, the second corner C2, the third corner C3 and/or the fourth corner C4 of the display panel 10. The jigs J1 to J4 can mark or fix the positions of the display panels 10 and 110. Accordingly, the convenience for assembling of the display device 100 can be improved. After assembling, the jigs J1 to J4 can be removed.

The marks A1 to A12 can be displayed or attached to the rear surface of the display panel 10, 110. The marks A1 to A12 can be for mounting of the strut bars 130 to be described later. Accordingly, the convenience for assembling of the display device 100 can be improved. After assembling, the marks A1 to A12 can be removed.

Figure 6:
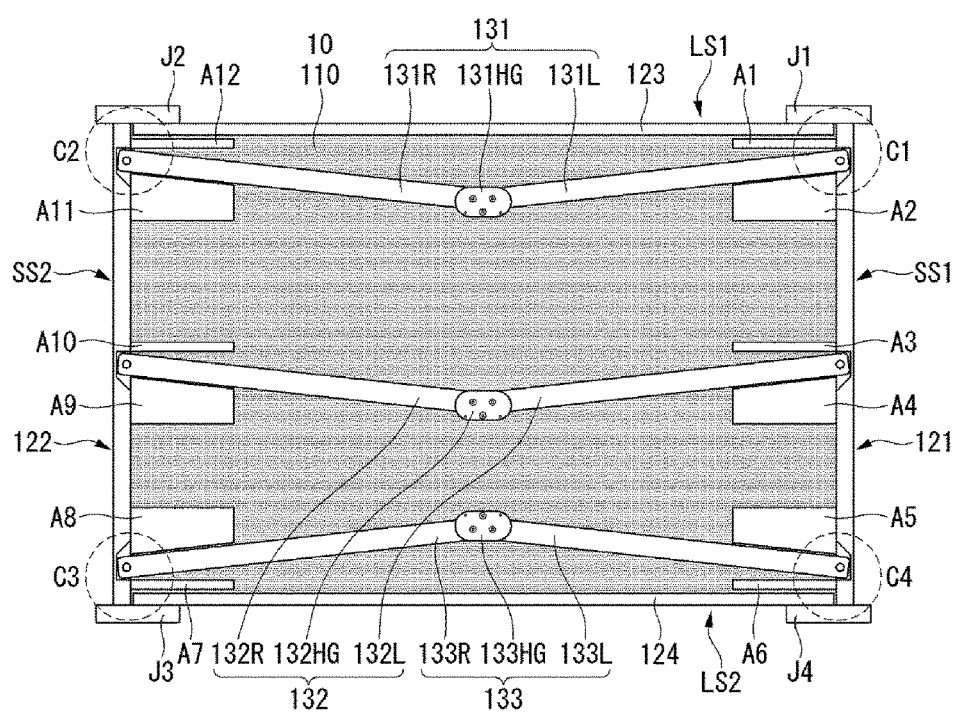

Referring to FIG. 6, the strut bar 130 can be mounted onto the first bar 121 and the second bar 122. The strut bar 130 can also pivot with respect to the first bar 121 and pivot with respect to the second bar 122. The strut bar 130 can thus be pivotally connected to the first bar 121 and/or the second bar 122. The strut bar 130 may include a hinge unit 130HG. As shown, a plurality of strut bars 130 can be provided. The strut bar 130 can also be referred to as a support bar 130 or a frame 130 or a supporter 130.

In FIG. 6, the first strut bar 131 is placed adjacent to the first long side LS1 of the display panel 10,110. The first strut bar 131 is also spaced apart from the third bar 123. In addition, the first strut bar 131 can be mounted onto the first bar 121 and/or the second bar 122. The third strut bar 133 can be placed adjacent to the second long side LS2 of the display panel 10,110. Also, the third strut bar 133 is spaced from the fourth bar 124. The third strut bar 133 can be mounted onto the first bar 121 and/or the second bar 122. Also, the second strut bar 132 can be placed between the first strut bar 131 and the third strut bar 133. The second strut bar 132 can also be mounted onto the first bar 121 and/or the second bar 122.

As shown, the first strut bar 131 can be bent toward the third strut bar 133, and the third strut bar 133 can be bent toward the first strut bar 131. Similarly, the second strut bar 132 can be bent toward the third strut bar 133 or the first strut bar 131. Bending of the strut bars 130 can be performed by using the hinge units 130HG.

Figure 7:
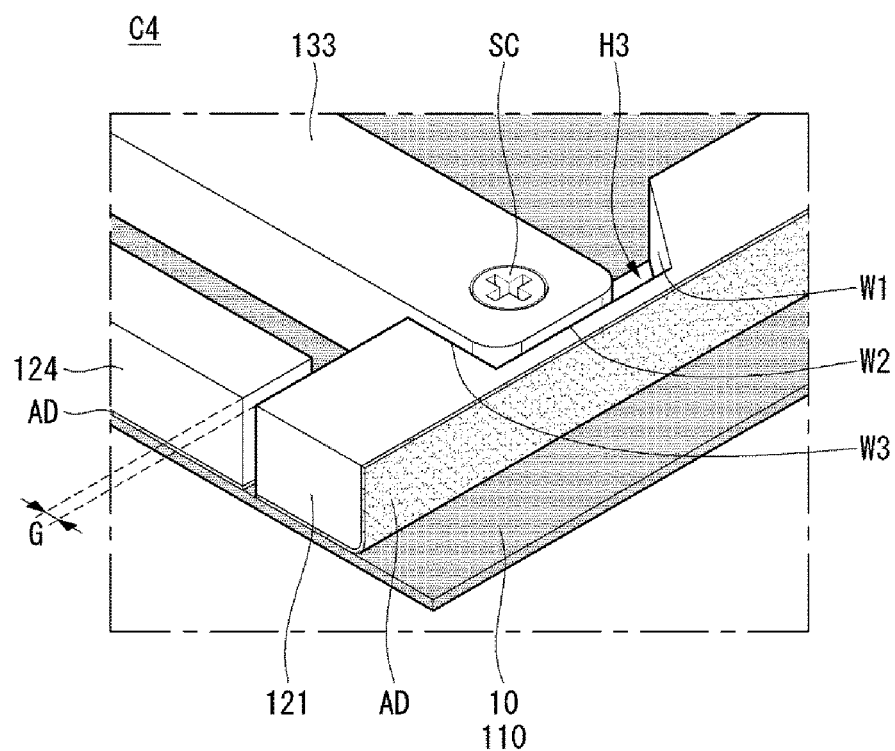
FIGS. 7 to 13 are views showing examples of a structure for securing a tension of a display device according to an embodiment of the present invention.
Figure 8:
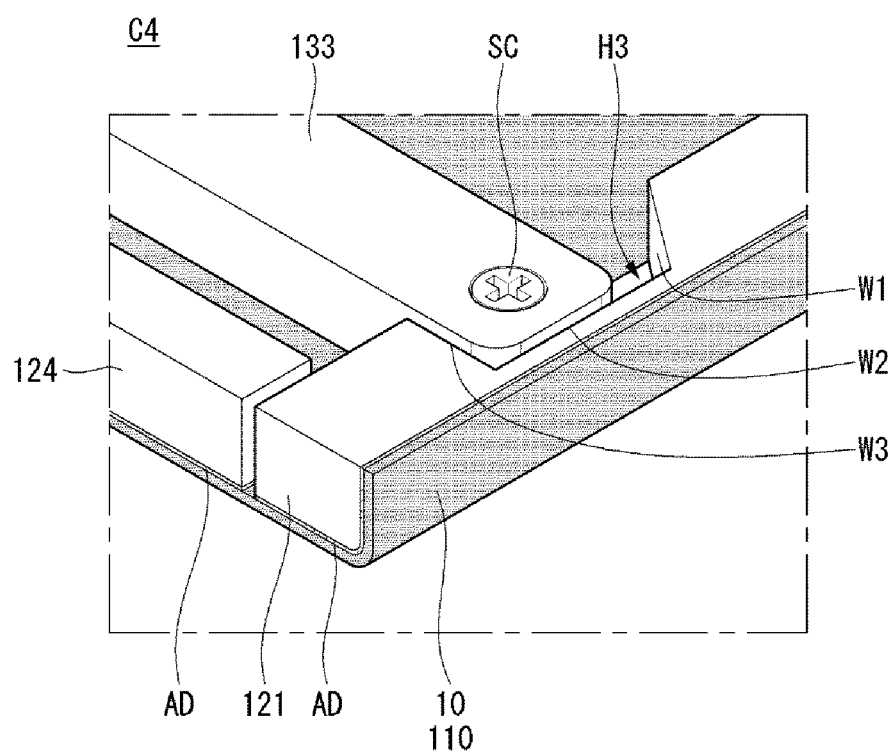

Referring to FIGS. 7 and 8, the third strut bar 133 can be mounted onto or coupled with the first bar 121 by a fastening member SC. The third strut bar 133 can also pivot with respect to the first bar 121. For example, the fastening member SC may be a screw. As shown, the first bar 121 may have a rectangular cross section. In addition, an adhesive member AD may be adhered to the front surface and/or the lateral surface of the first bar 121. For example, the adhesive member AD may be a double-sided tape.

As shown, the fourth bar 124 can have a rectangular cross section, and the adhesive member AD can be adhered to the front surface of the fourth bar 124. The display panel 10, 110 can be fixed to the front surface of the fourth bar 124. The display panels 10 and 110 may also be fixed to the front surface and/or the lateral surface of the first bar 121. As shown in FIG. 8, the display panel 10 and 110 can be rounded or bent around the first bar 121. The display panel 10 and 110 can also cover the first bar (121). Further, the first corner C1, the second corner C2 and/or the third corner C3 can be described substantially the same as the description of the fourth corner C4.

Figure 9:
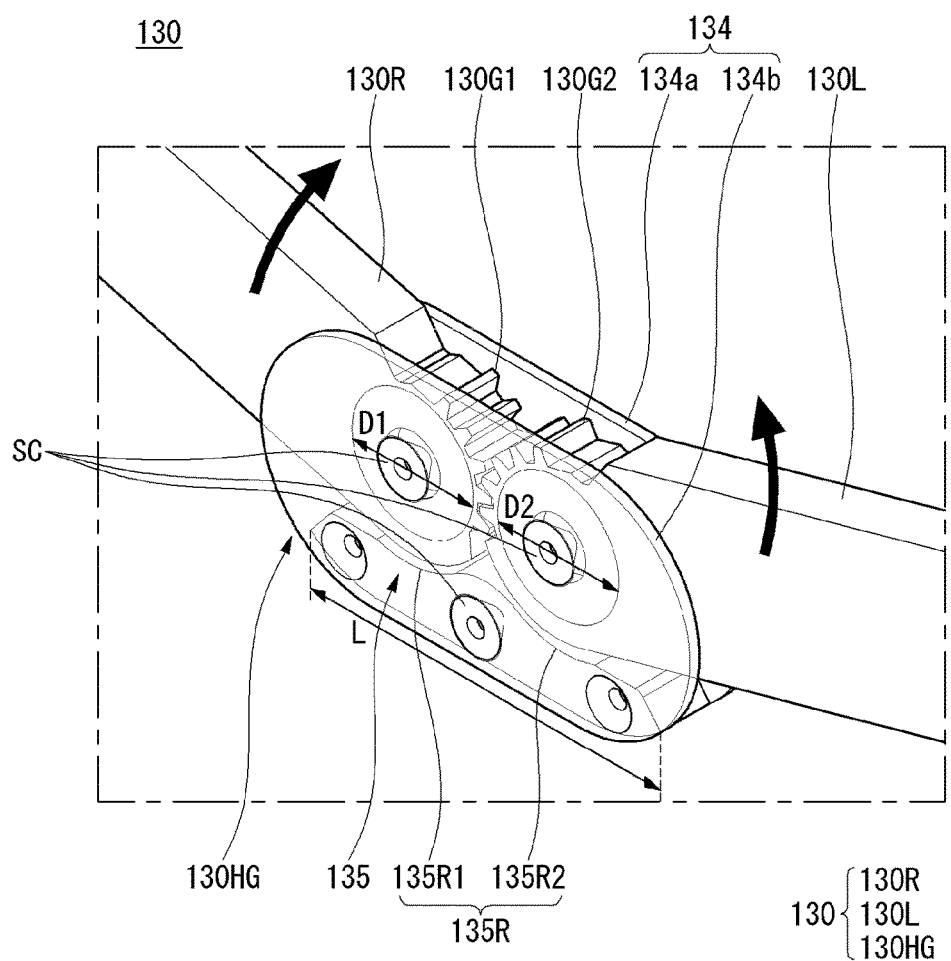
Figure 10:
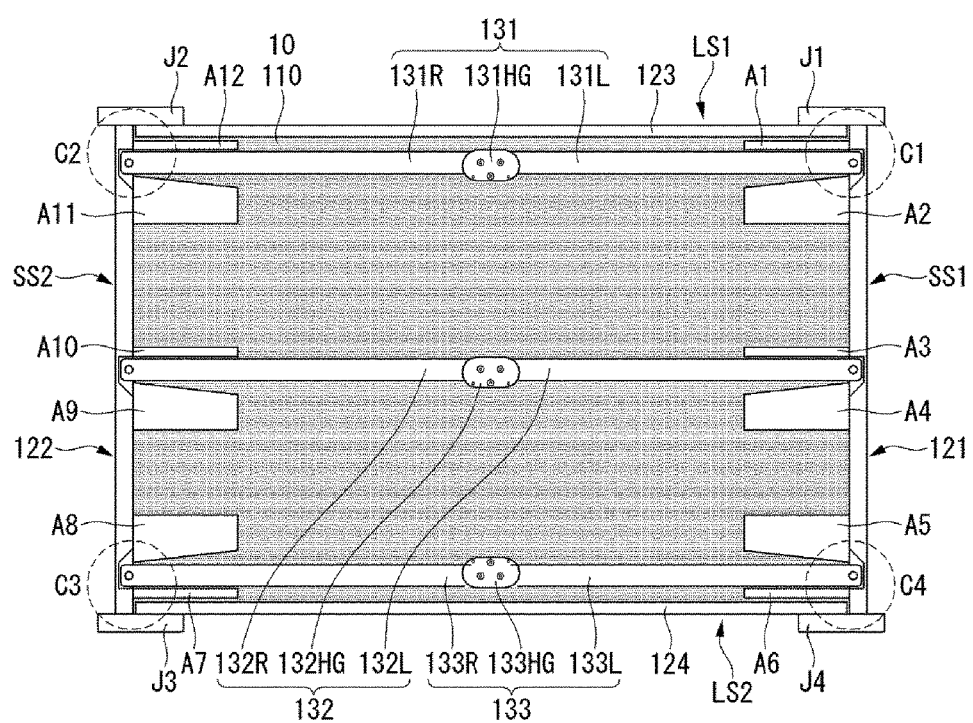
Figure 11:
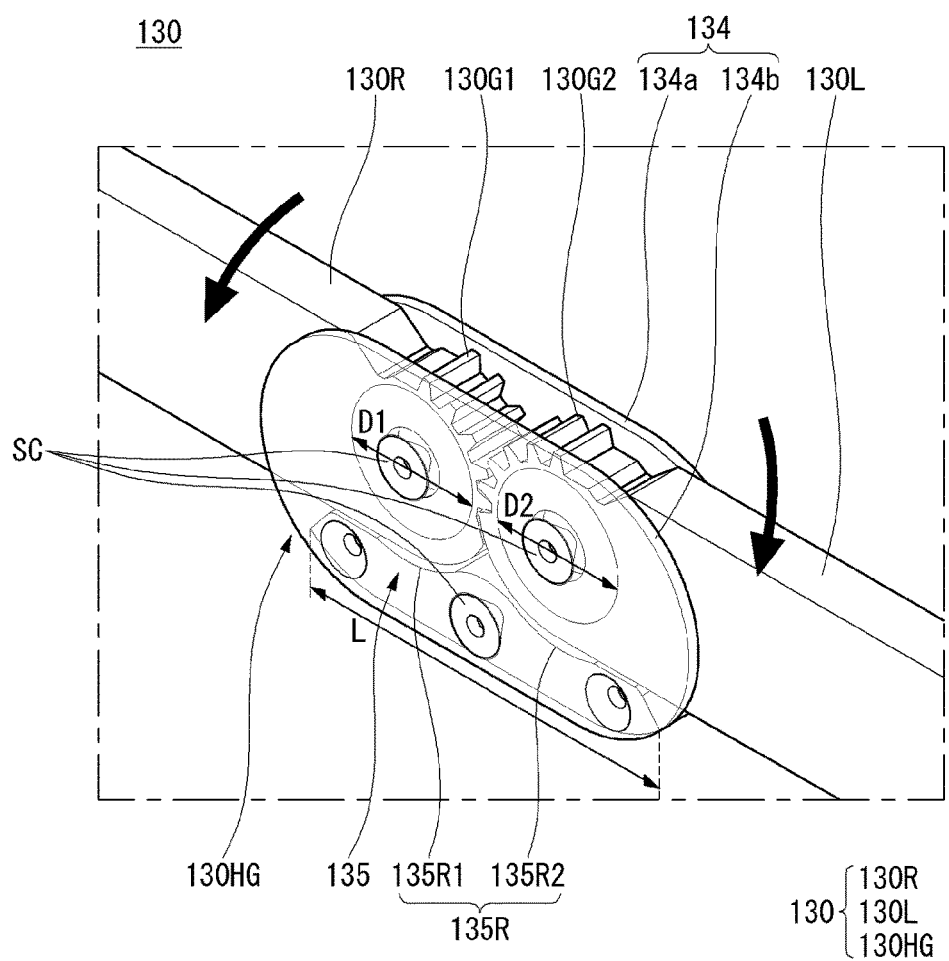

Referring to FIGS. 9-11, the strut bar 130 may include a first arm 130R, a second arm 130L, a housing 134, a first gear 130G1, and a second gear 130G2. An end of the first arm 130R is pivotally connected to the second bar 122. The end of the first arm 130R may be referred to as a distal end of the first arm 130R. In addition, an end of the second arm 130L is pivotally connected to the first bar 121. The end of the second arm 130L may be referred to as a distal end of the second arm 130L.

Further, the first gear 130G1 is positioned at another end of the first arm 130R. The other end of the first arm 130R may be referred to as a proximal end of the first arm 130R. Also, the second gear 130G2 is positioned at another end of the second arm 130L. The other end of the second arm 130L may be referred to as a proximal end of the second arm 130L. In addition, the first gear 130G1 can be engaged with the second gear 130G2, and the first arm 130R can pivot with respect to the second arm 130L. The second arm 130L can also pivot with respect to the first arm 130R.

The first gear 130G1 and/or the second gear 130G2 may be installed or mounted inside the housing 134 and can rotate within the housing 134. The first gear 130G1 and/or the second gear 130G2 can also be mounted on the housing 134 by using a screw SC. As shown, the housing 134 includes a first plate 134a and a second plate 134b. The first plate 134a and the second plate 134b are opposed to each other and can cover the first gear 130G1 and/or the second gear 130G2. For example, the first plate 134a and/or the second plate 134b may be an elliptical plate.

The stopper 135 can be positioned between the first plate 134a and the second plate 134b and be coupled with the housing 134. The stopper 135 can face the lateral side of the first gear 130G1 and/or the second gear 130G2. The stopper 135 can also be fixed to the first plate 134a and/or the second plate 134b by using screws SC. As shown, the length L of the stopper 135 is greater than the sum of the diameter D1 of the first gear 130G1 and the diameter D2 of the second gear 130G2. A lateral surface of an end portion of the stopper 135 faces the lateral surface of the first arm 130R. A lateral surface of another end portion of the stopper 135 faces the lateral surface of the second arm 130L. The stopper 135 also includes a recessed portion 135R. The recessed portion 135R may be formed on the lateral surface of the stopper 135 and be recessed to form a curved surface inward from the outer surface of the stopper 135. The recessed portion 135R may include a first recessed portion 135R1 and a second recessed portion 135R2.

In addition, the first recessed portion 135R1 faces the first gear 130G1 and the second recessed portion 135R2 faces the second gear 130G2. When the first gear 130G1 of the first arm 130R rotates, the first recessed portion 135R1 can maintain a certain distance from the outer circumferential surface of the first gear 130G1. Also, when the second gear 130G2 of the second arm 130L rotates, the second recessed portion 135R2 can maintain a certain distance from the outer circumferential surface of the second gear 130G2.

Accordingly, the movement of the first arm 130R and the second arm 130L can be restricted. In addition, the stopper 135 allows the clockwise rotation of the first arm 130R and the counterclockwise rotation of the second arm 130L, when the first arm 130R and the second arm 130L are horizontal. The stopper 135 can also restrict the counterclockwise rotation of the first arm 130R and the clockwise rotation of the second arm 130L, when the first arm 130R and the second arm 130L are horizontal. The first arm 130R and the second arm 130L being horizontal means the first arm 130R and the second arm 130L are unfolded with respect to the hinge unit 130HG.

Figure 12:
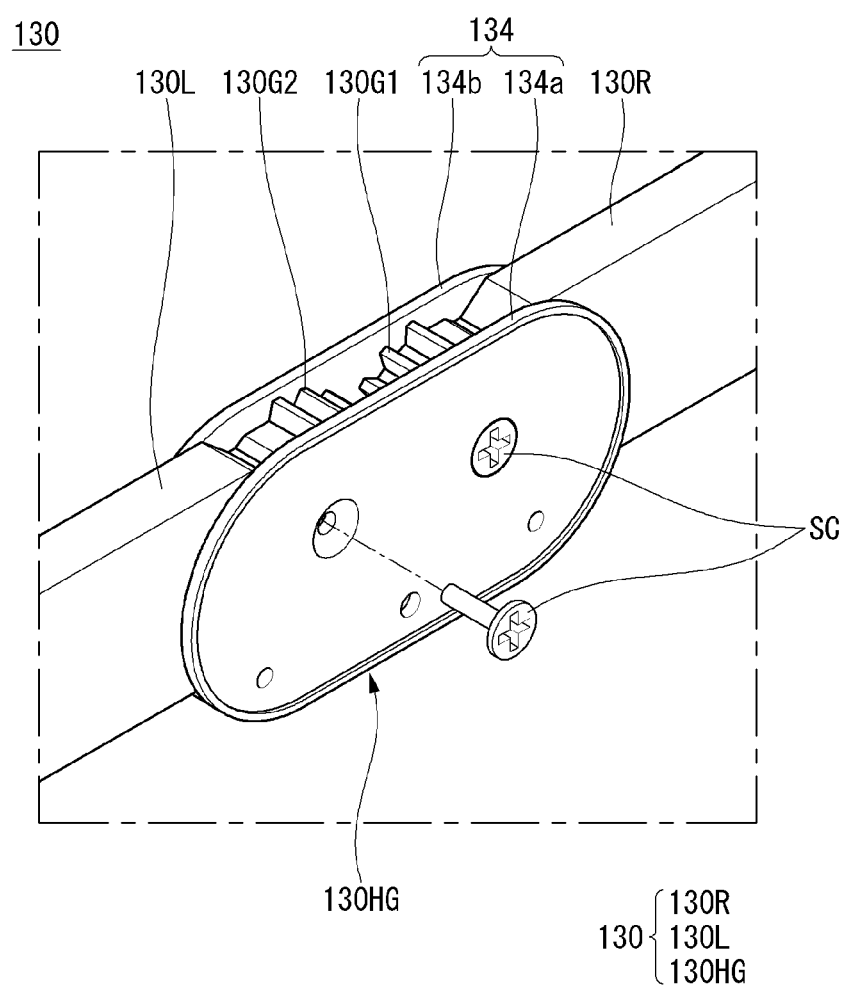
Figure 13:
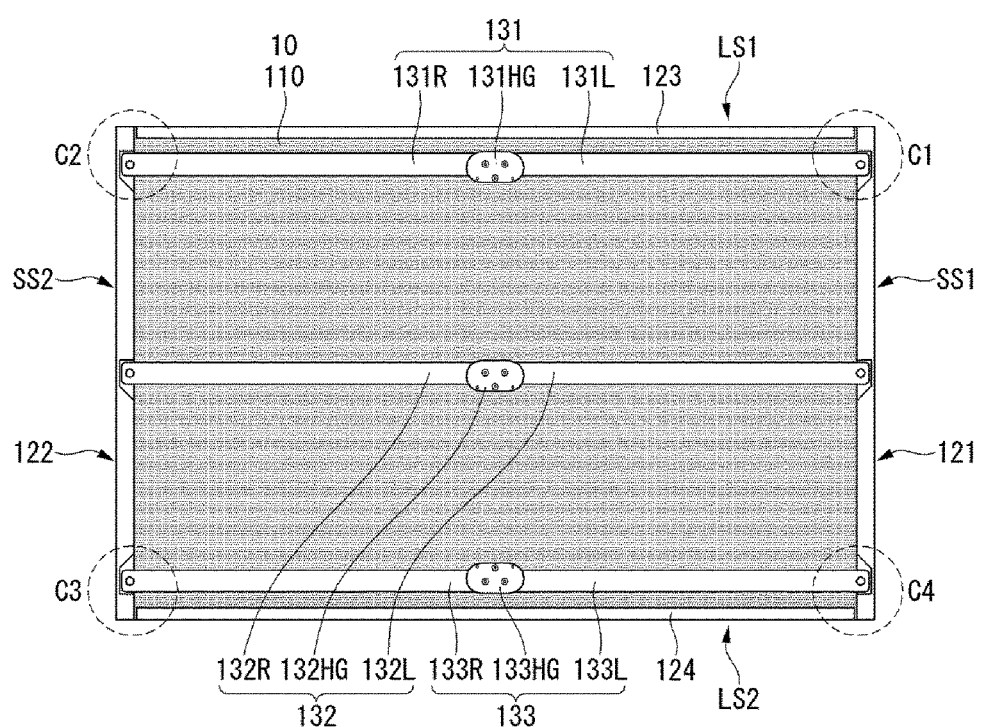

Referring to FIGS. 12 and 13, when the fastening member SC is mounted on the first plate 130a of the housing 134 when the first arm 130R and the second arm 130L are horizontal, the first gear 130G1 (see FIG. 11), and/or the second gear 130G2 (see FIG. 11) can be fixed to the housing 134. The strut bar 130 can also have the first bar 121 maintain at a certain distance from the second bar 122. The tension by the strut bar 130 can be transmitted to the display panel 10, 110 and the display panels 10 and 110 can maintain being flat.

Figure 14:
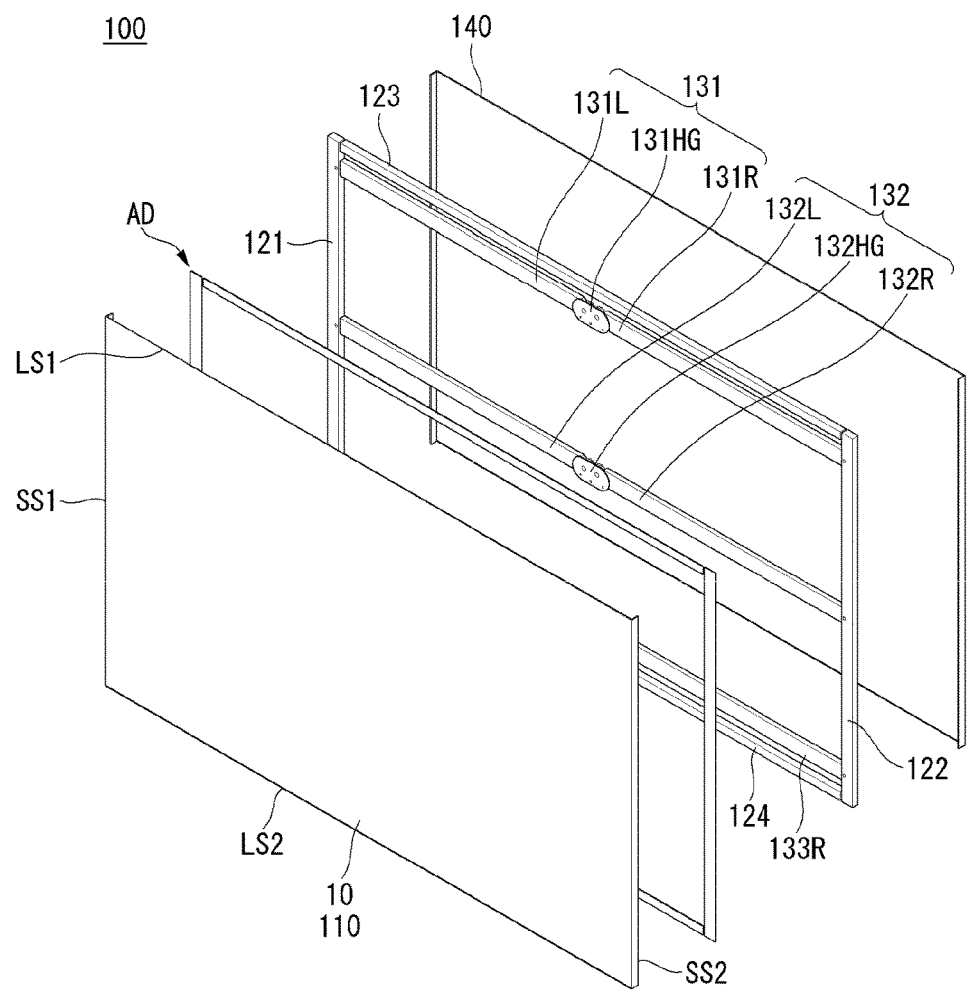
FIGS. 14 to 24 are views showing examples of the structure of a display device according to an embodiment of the present invention.
Figure 15:
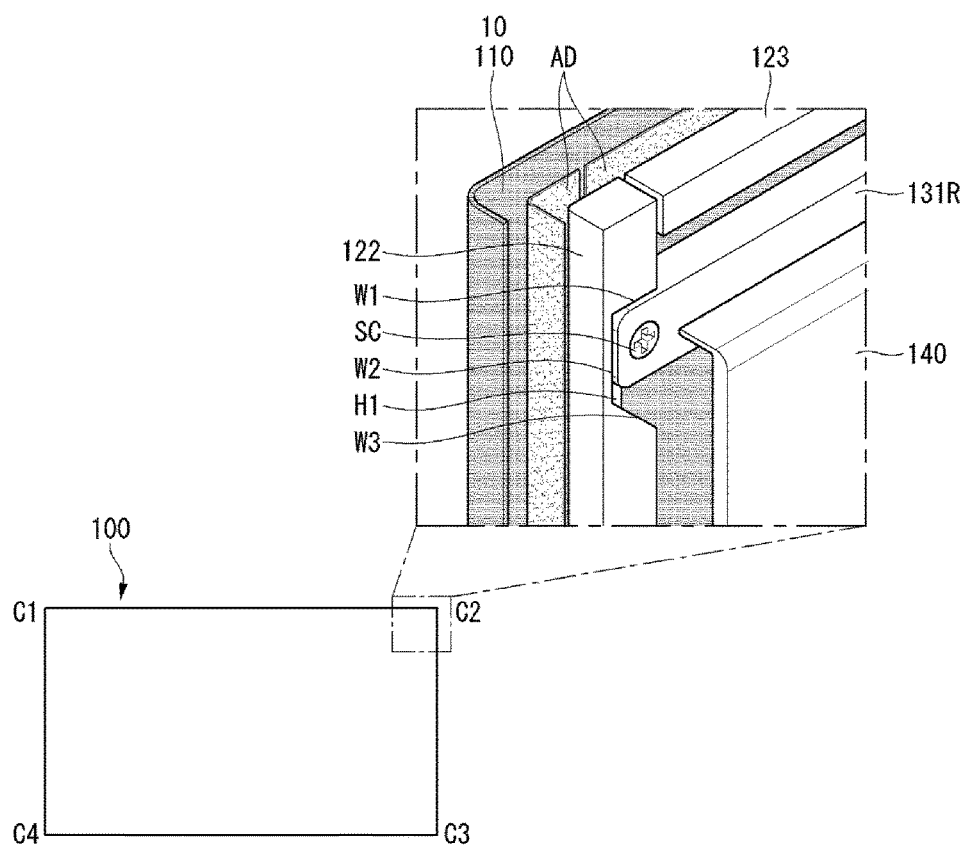

Referring to FIGS. 14 and 15, the rigid bars 120 can be positioned behind the display panels 10 and 110 and the bars 130 can be mounted between or behind the rigid bars 120. The back cover 140 can be positioned at the rear of the rigid bars 120 and/or the strut bars 130. The back cover 140 may be coupled with the rigid bars 120 and/or the strut bars 130. The display panels 10 and 110 can be fixed to the rigid bars 120 by an adhesive member AD. Further, the rigid bars 120 can be fixed by an adhesive member AD adjacent to four edges of the display panel 10, 110, respectively.

The first rigid bar 121 can be fixed to the rear surface of the display panel 10 or 110. In addition, the first rigid bar 121 can be adjacent to the first short side SS1 of the display panel 10 or 110, the second rigid bar 122 can be fixed to the rear surface of the display panel 10,110 and be adjacent to the second short side SS2 of the display panel 10,110, the third rigid bar 123 can be fixed to the rear surface of the display panel 10 or 110 and be adjacent to the first long side LS1 of the display panel 10 or 110, and the fourth rigid bar 124 can be fixed to the rear surface of the display panel 10 or 110 and be adjacent to the second long side LS2 of the display panel 10 or 110. The third rigid bar 123 and/or the fourth rigid bar 124 may also be omitted. Further, the fixing of the display panel 10, 110 can be performed by the adhesive member AD. For example, the adhesive member AD may be a double-sided tape or a bond.

In addition, the strut bar 130 can be positioned from the first rigid bar 121 to the second rigid bar 122. The plurality of strut bars 130 can also be provided. To balance the distance between the first rigid bar 121 and the second rigid bar 122, the number of strut bars 130 may be at least two. Further, the first strut bar 131 can be positioned adjacent to the first long side LS1 of the display panel 10,110. An end of the first strut bar 131 can be pivotally connected to the first rigid bar 121 and another end of the first strut bar 131 can be pivotally connected to the second rigid bar 122. The third strut bar 133 can be positioned adjacent to the second long side LS2 of the display panel 10,110. An end of the third strut bar 133 can be pivotally connected to the first rigid bar 121 and another end of the third strut bar 133 can be pivotally connected to the second rigid bar 122. The second strut bar 132 can also be positioned between the first strut bar 131 and the third strut bar 133. An end of the second strut bar 132 can be pivotally connected to the first rigid bar 121 and another end of the second strut bar 132 can be pivotally connected to the second rigid bar 122. The first strut bar 131 to the third strut bar 133 can provide the same tension to the display panel 10, 110.

In addition, the back cover 140 is opposite to or faces the display panel 10, 110. The area of the back cover 140 may be approximately equal to the area of the display panel 10, 110. The back cover 140 may also be a plate and can be referred to as a module cover 140 or a rear cover 140.

Figure 16:
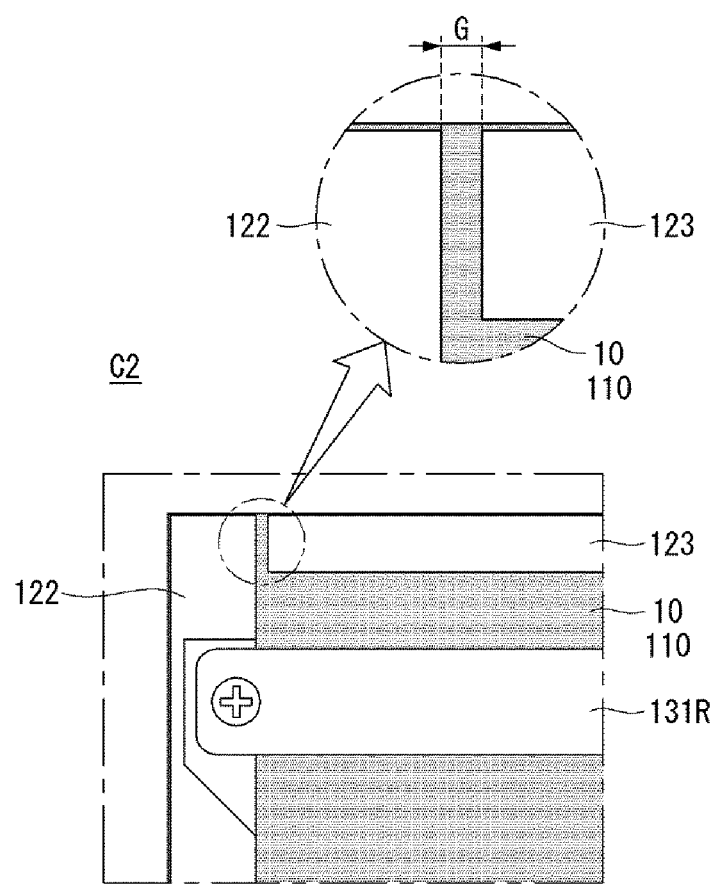

Referring to FIG. 16, the third rigid bar 123 is spaced a certain distance G from the second rigid bar 122. In particular, a gap G is formed between the third rigid bar 123 and the second rigid bar 122. The size of the gap G may vary in accordance with the movement of the first arm 131R of the first strut bar 131 (see FIG. 13). In addition, the first strut bar 131 can secure the flatness of the display panels 10 and 110 by moving the first rigid bar 121 (see FIG. 13) and the second rigid bar 122 away from each other. A clearance may be required between the third rigid bar 123 and the second rigid bar 122 when the distance between the first rigid bar 121 and the second rigid bar 122 varies. In addition, the gap G may provide clearance between the third rigid bar 123 and the second rigid bar 122. The same description can be applied to the first corner C1, the third corner C3, and/or the fourth corner C4, although the second corner C2 has been described as an example.

Figure 17:
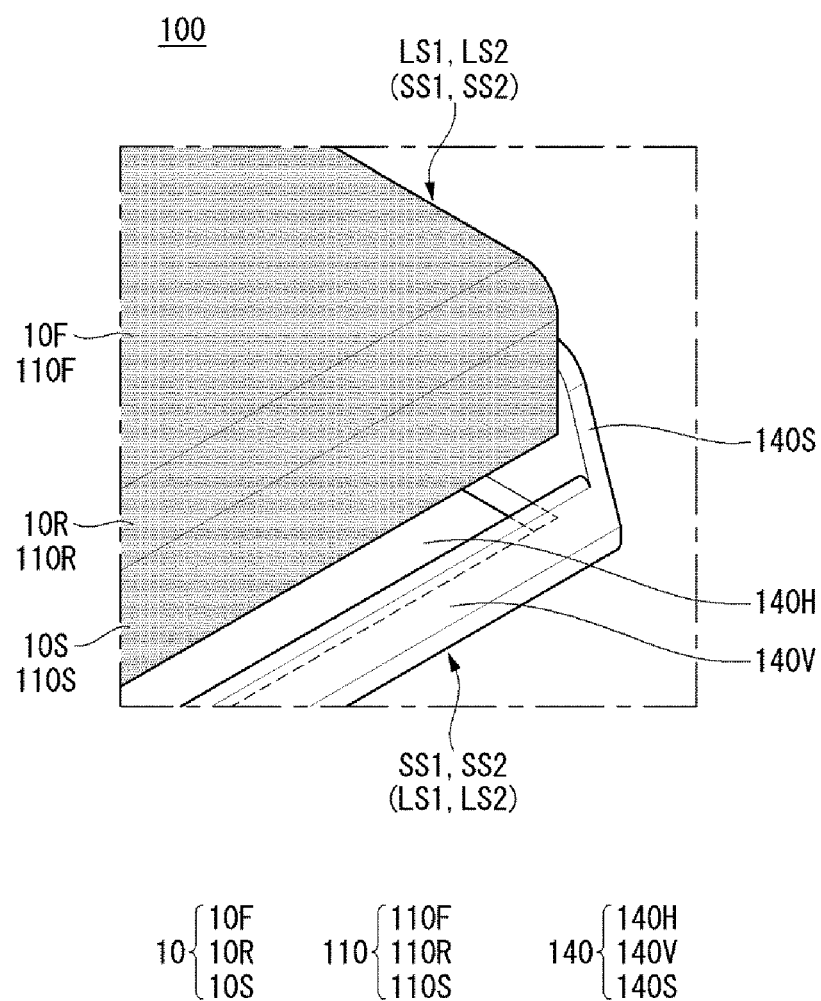
Figure 18:
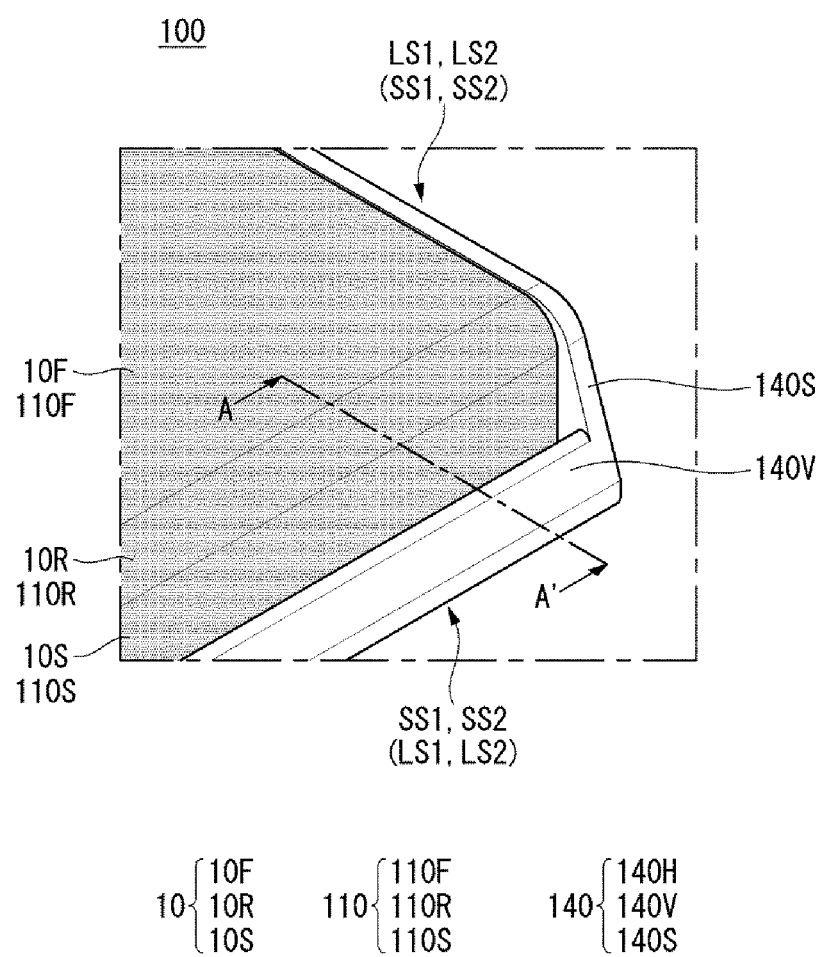
Figure 19:
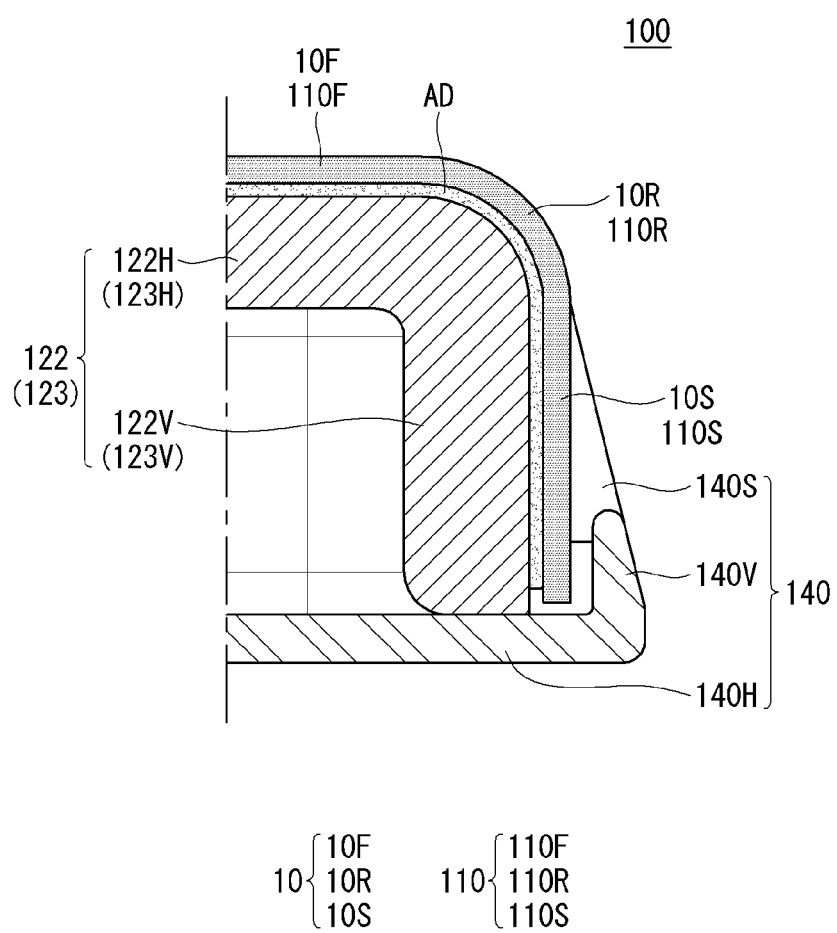

Referring to FIGS. 17 to 19, the back cover 140 can be positioned at the rear of the display panel 10, 110 and can be coupled with the rear portion of the display panel 10, 110. The back cover 140 may include a back plate 140H, a side cover 140S, and a side wall 140V. The back plate 140H can form a horizontal surface or a horizontal plate of the back cover 140, and the side cover 140S and/or the side wall 140V can form a vertical surface or a vertical plate of the back cover 140.

In addition, the display panel 10 and 110 may include flat surface part 10F and 110F, a round surface part 10R and a side surface part 10S. The flat surface part 10F and 110F may be referred to as a front surface part 10F and 110F or a front part 10F and 110F or a first part 10F and 110F. The round surface part 10R and 110R may be referred to as curved part 10R and 110R or second part 10R and 110R, and the side surface part 10S and 110S may be referred to as side part 10S and 110S or third part 10S and 110S.

The flat surface part 10F and 110F can form a front surface of the display device 100, and the round surface part 10R and 110R can be bent and extended from the first part 10F and 110F. In addition, the round surface part 10R and 110R may have a constant curvature. The side surface part 10S and 110S is bent and extended from the side surface part 10R and 110R. Thus, the side surface part 10S and 110S forms at least a portion of the lateral side of the display device 100. The flat surface part 10F and 110F and the side surface part 10S and 110S can also be flat.

A part of the side surface part 10S and 110S of the display panel 10 and 110 can be covered by the back cover 140. In addition, the side wall 140V can be positioned adjacent to the edge of the side surface part 10S, 110S of the display panel 10, 110. The side wall 140V covers the edge of the side surface part 10S and 110S of the display panels 10 and 110. Further, the side wall 140V faces or cover the front surface of the display panels 10 and 110 adjacent to the edge of the side surface part 10S and 110S of the display panel 10 and 110.

In addition, the side cover 140S is located on the first long side LS1 or the second long side LS2 of the display panel 10, 110. The round surface part 10R and 110R and/or the side surface part 10S and 110S of the display panel 10 and 110 is located at the first short side SS1 or the second short side SS2 of the display panel 10 and 110. The above case may be referred to as a left-right bending of the display panel 10 and 110. The side cover 140S is located at the first short side SS1 or the second short side SS2 of the display panel 10. Also, the round surface part 10R and 110R and/or the side surface part 10S and 110S of the display panel 10 and 110 is located on the first long side LS1 or the second long side LS2 of the display panel 10 and 110. The above case may be referred to as an up-down bending of the display panel 10 and 110.

For the left-right bending of the display panel 10 and 110, the second rigid bar 122 may include a horizontal part 122H and a vertical part 122V. In addition, the vertical part 122V can be supported by the back plate 140H of the back cover 140. Horizontal part 122H can be bent and extended from vertical part 122V. Further, the outer surface of the vertical part 122V and the outer surface of the horizontal part 122H can be connected while being curved. The adhesive member AD may be adhered to the horizontal part 122H and/or the vertical part 122V of the second rigid bar 122.

The display panels 10 and 110 can be fixed to the outer surface of the second rigid bar 122 by the adhesive member AD. Accordingly, the round surface part 10R and 110R of the display panel 10, 110 can be formed. Further, the side wall 140V of the back cover 140 prevents the side portions 10S and 110S of the display panel 10 and 110 from being away or being deployed from the vertical part 122V of the second rigid bar 122. For the up-down bending of the display panel 10 and 110, the second rigid bar 122 may be the third rigid bar 123. The above description can be applied to all the edges of the display panel 10 and 110 and all the corners C1, C2, C3, and C4.

Figure 20:
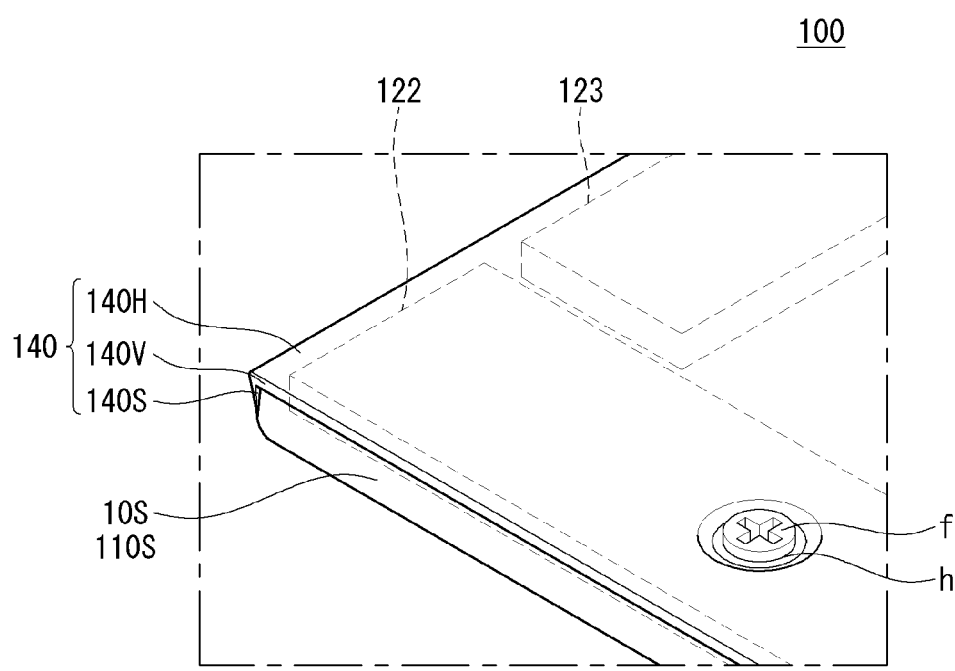

Referring to FIG. 20, the back cover 140 can be fixed or coupled to the rigid bar 124 by a fastening member f. The back plate 140H of the back cover 140 may also have a fastening hole h. Further, the fourth rigid bar 124 may have a fastening hole h corresponding to the fastening hole h of the back plate 140H on the rear surface thereof. Thus, the fastening member f can fasten the back cover 140 to the fourth rigid bar 124 while passing through the fastening holes h.

Figure 21:
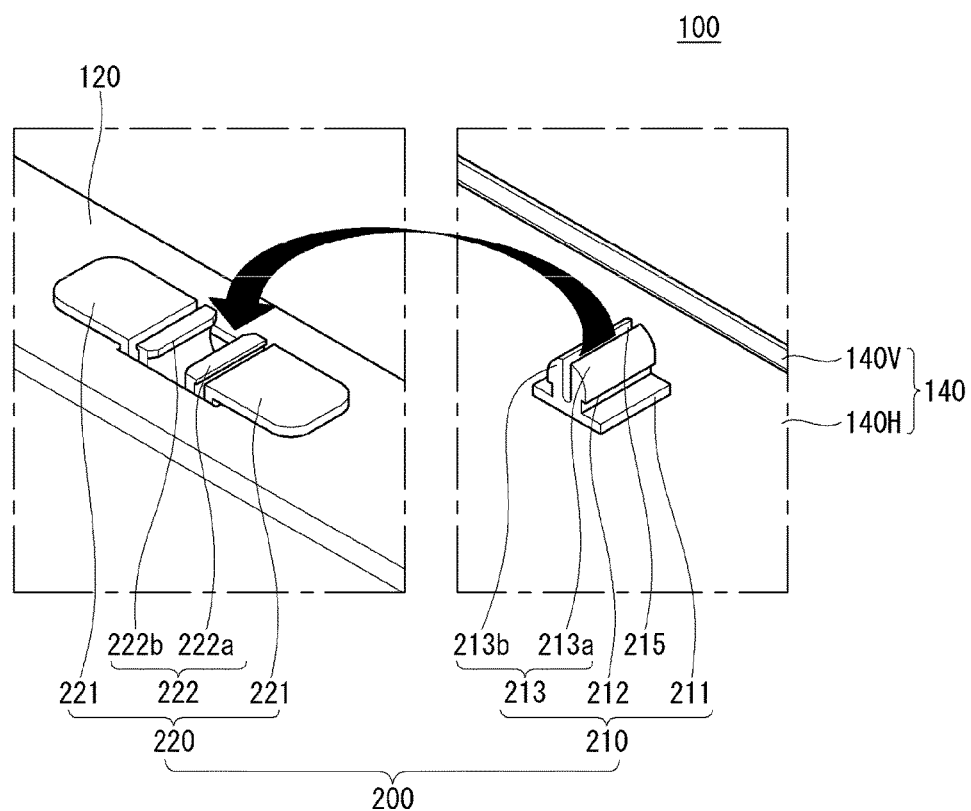

Referring to FIG. 21, the coupler 200 can be mounted to the rigid bar 120 and/or the back cover 140. The coupler 200 can include a holder 220 and an insert 210. The insert 210 may include a base 211, a neck 212, and a head 213. Further, the base 211 can be a plate and can be fixed to the back cover 140. The neck 212 is extended toward the head 213 from the top surface of the base 211 and may have a circular or elliptical cross section. In addition, the slit 215 may be formed in the head 213, and the head 213 can be divided into the first part 213a and the second part 213b by the slit 215. The diameter or thickness of the head 213 may also be greater than the thickness of the neck 212. Further, the head 213 may have a shape of a cylinder as a whole.

As shown, the holder 220 may include a base 221 and a finger 222. The base 221 can be a plate and can be fixed to the rigid bar 120. In addition, the finger 222 can be fixed to the base 221 or be extended from the base 221. The finger 222 may also include a first part 222a and a second part 222b. The first part 222a is spaced apart from the second part 222b. The fingers 222 may also have elasticity. Further, the first part 222a of the finger 222 can be movable toward or away from the second part 222b of the finger 222. The finger 222 may have a generally C-shaped cross-section. Also, the back cover 140 can be engaged or fixed to the rigid bar 120, when the head 213 of the insert 210 is inserted into the finger 222 of the holder 220.

Figure 22:
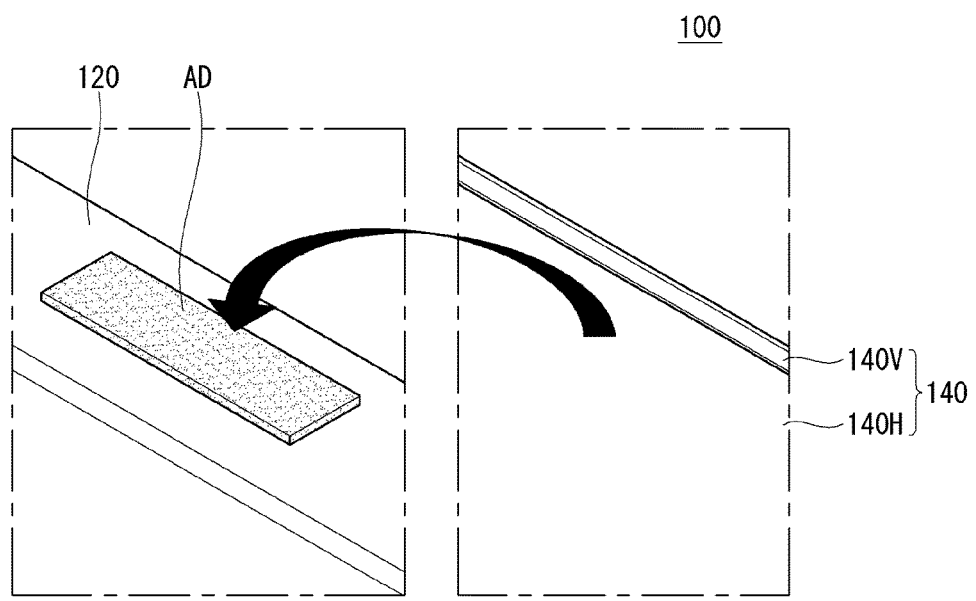

Referring to FIG. 22, the back cover 140 can be fixed or coupled to the rigid bar 124 by an adhesive member AD. For example, the adhesive member AD can be adhered to the rear surface of the fourth rigid bar 124. In addition, the front surface of the back plate 140H can be adhered to the adhesive member AD, and the back cover 140 can be fixed to the rear surface of the fourth rigid bar 124.

Figure 23:
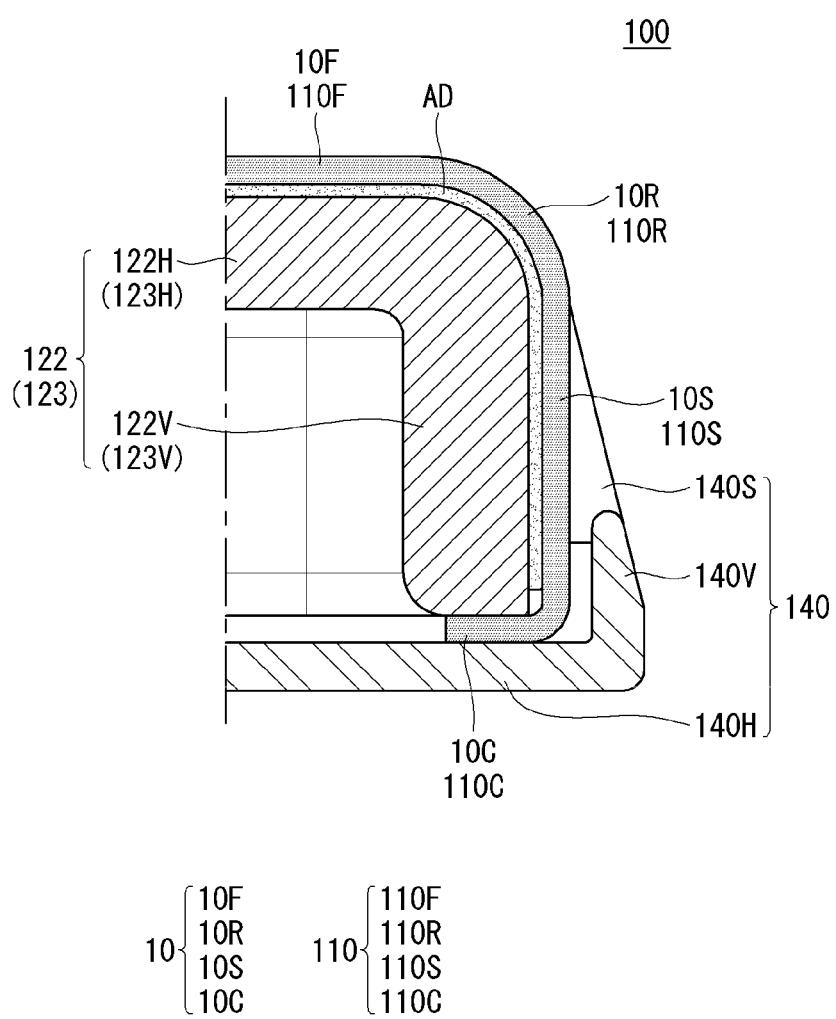

Referring to FIG. 23, the back cover 140 can be coupled to the rear portion of the display panel 10 and 110 and include a back plate 140H, a side cover 140S, and a side wall 140V. The back plate 140H forms a horizontal surface or a horizontal plate of the back cover 140, and the side cover 140S and/or the side wall 140V forms a vertical surface or a vertical plate of the back cover 140.

Also, the display panel 10 and 110 may include flat surface part 10F and 110F, round surface part 10R and 110R, side surface part 10S and 110S and curled part 10C and 110C. In addition, the curled part 10C and 110C may be referred to as a rear part 10C and 110C or a fourth part 10C and 110C.

The flat surface part 10F and 110F form a front surface of the display device 100, and the round surface part 10R and 110R can be bent and extended from the flat surface part 10F and 110F. The round surface part 10R and 110R may have a constant curvature. Further, the side surface part 10S and 110S can be bent and extended from the round surface part 10R and 110R. The side surface part 10S and 110S may form at least a part of the side surface of the display device 100. In addition, the curled part 10C and 110C can be bent and extended from the side surface part 10S and 110S. The flat surface part 10F and 110F and the side surface part 10S and 110S can be flat.

A portion of the side surface part 10S and 110S of the display panel 10 and 110 can be covered by the back cover 140. Also, the side wall 140V can be positioned adjacent to the side surface part 10S and 110S of the display panel 10 and 110.

As shown, the side cover 140S is located on the first long side LS1 or the second long side LS2 of the display panel 10 and 100. In addition, the round surface part 10R and 110R and/or the side surface part 10S and 110S and/or the curled part 10C and 110C of the display panel 10 and 110 can be disposed on the first short side SS1 or the second short side SS2. The above case may be referred to as left-right bending of the display panel 10, 110. Alternatively, the side cover 140S may be located at the first short side SS1 or the second short side SS2 of the display panel 10 and 110. In addition, the curved part 10R and 110R and/or the side surface part 10S and 110S and/or the curled part 10C and 110C of the display panels 10 and 110 may be disposed on the first long side LS1 or the second long side LS2. The above case may be referred to as up-down bending of the display panel 10 and 110.

For the left-right bending of the display panel 10 and 110, the second rigid bar 122 may include a horizontal part 122H and a vertical part 122V. The vertical part 122V can be supported by the back plate 140H of the back cover 140, and the horizontal part 122H can be bent and extended from the vertical part 122V. In addition, the outer surfaces of the vertical part 122V and the outer surface of the horizontal part 122H can be connected while being curved. The adhesive member AD may be adhered to the outer surface of the horizontal part 122H and/or the vertical part 122V of the second rigid bar 122.

In addition, the display panel 10 and 110 can be fixed to the outer surface of the second rigid bar 122 by the adhesive member AD. The curled part 10C and 110C can be fixed to the rear surface of the vertical portion 122V of the second rigid bar 122. In addition, the curled part 10C and 110C can be positioned or fixed between the back plate 140H of the back cover 140 and the vertical part 122V of the second rigid bar 122. Accordingly, the fixing of the display panel 10 and 110 can be stronger. For the up-down bending of the display panels 10 and 110, the second rigid bar 122 may be the third rigid bar 123.

Figure 24:
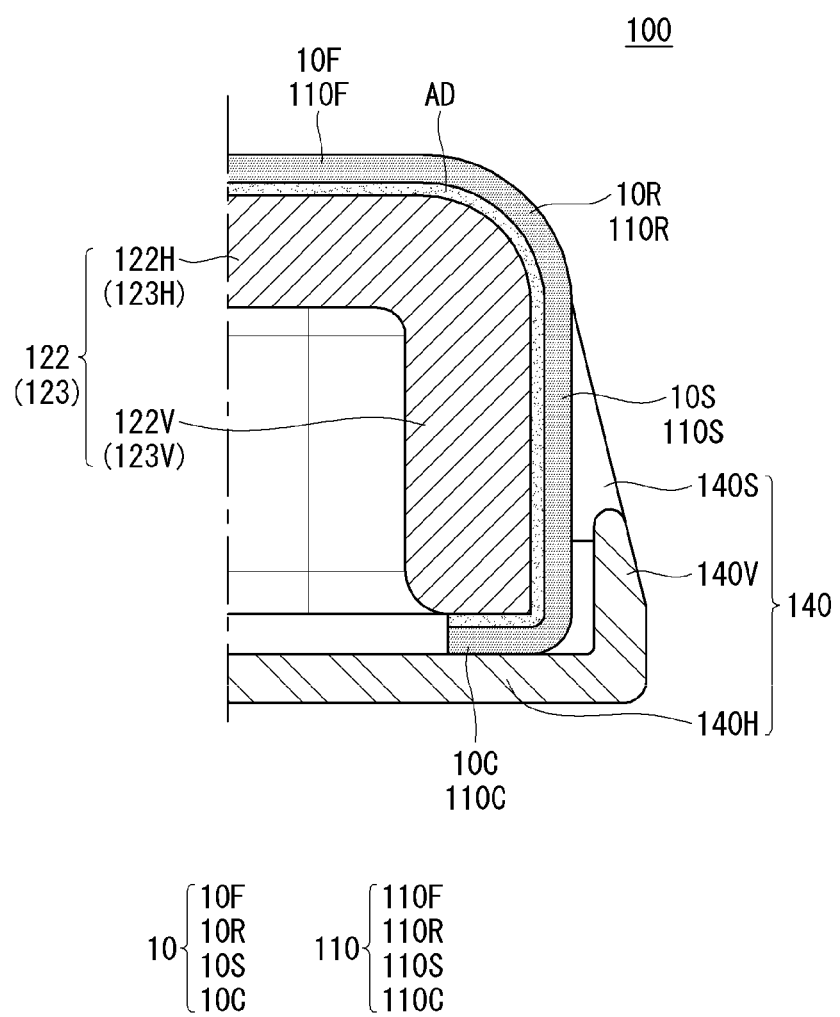

Referring to FIG. 24, the back cover 140 can be positioned at the rear of the display panel 10 and 110 and be coupled with the rear portion of the display panel 10 and 110. In addition, the back cover 140 may include a back plate 140H, a side cover 140S, and a side wall 140V. The back cover 140H can form a horizontal surface or a horizontal plate of the back cover 140, and the side cover 140S and/or the side wall 140V can form a vertical surface or a vertical plate of the back cover 140.

Further, the display panel 10 and 110 may include flat surface part 10F and 110F, round surface part 10R and 110R, side surface part 10S and 110S, and curled part 10C and 110C. The flat surface part 10F and 110F may be referred to as front part 10F and 110F. The flat surface part 10F and 110F form the front surface of the display device 100, and the curved part 10R and 110R can be bent and extended from the flat surface part 10F and 110F. In addition, the curved part 10R and 110R may have a constant curvature. Also, side surface part 10S and 110S can be bent and extended from the round surface part 10R and 110R. The side surface part 10S and 110S form at least a part of the side surface of the display device 100. In addition, curled part 10C and 110C can be bent and extended from the side surface part 10S and 110S. The flat surface part 10F and 110F and the side surface part 10S and 110S can be flat.

A portion of the side surface part 10S and 110S of the display panel 10 and 110 can be covered by the back cover 140. The side wall 140V can be positioned adjacent to the side portions 10S and 110S of the display panel 10 and 110.

The side cover 140S is located at the first long side LS1 or the second long side LS2 of the display panel 10 and 110. The round surface part 10R and 110R and/or the side surface part 10S and 110S and/or the curled part 10C and 110C of the display panel 10 and 110 may be disposed on the first short side SS1 or the second short side SS2. The above case can be referred to as left-right bending of the display panel 10 and 110. Alternatively, the side cover 140S may be located at the first short side SS1 or the second short side SS2 of the display panel 10 and 110. The curved part 10R and 110R and/or the side surface part 10S and 110S and/or the curled part 10C and 110C of the display panel 10 and 110 may be disposed on the first long side LS1 or the second long side LS2. The above case can be referred to as up-down bending of the display panel 10 and 110.

For the left-right bending of the display panel 10, 110, the second rigid bar 122 may include a horizontal part 122H and a vertical part 122V. The vertical part 122V can be supported by the back plate 140H of the back cover 140. Horizontal part 122H may be bent and extended from the vertical part 122V, and the outer surfaces of the vertical part 122V and the outer surface of the horizontal part 122H can be connected while being curved. In addition, the adhesive member AD can be adhered to the horizontal part 122H and/or the vertical part 122V of the second rigid bar 122. Further, the adhesive member AD can be positioned between the vertical part 122V of the second rigid bar 122 and the back plate 140H of the back cover 140 and may be adhered to the vertical part 122V of the second rigid bar 122.

The display panel 10 and 110 can be fixed to the outer surface of the second rigid bar 122 by an adhesive member AD. In addition, the curled part 10C and 110C can be fixed to the rear surface of the vertical portion 122V of the second rigid bar 122. The curled part 10C and 110C can be positioned or fixed between the back plate 140H of the back cover 140 and the second rigid bar 122 together with the adhesive member AD. Accordingly, the fixing of the display panel 10, 110 is stronger. The curled part 10C and 110C may include a black material. The curled part 10C and 110C may be regions on which no image is displayed. For the up-down bending of the display panels 10 and 110, the second rigid bar 122 may be the third rigid bar 123.

The present invention provides many advantages. For example, according to at least one embodiment of the present invention, the structural rigidity of the display device can be secured, a bending of a display panel can be prevented, and convenience for combination of display device can be enhanced.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a first supporter;
    a second supporter located opposite the first supporter;
    a display panel extending between the first supporter and the second supporter and extending to side parts of the first supporter and the second supporter;
    a third supporter;
    a fourth supporter located opposite to the third supporter; and
    a first pivotable strut bar pivotally connected to the first supporter and the second supporter,
    wherein a first gap exists between the first supporter and the third supporter and a second gap exists between the first supporter and the fourth supporter,
    wherein a size of the first gap and the second gap changes based on a pivot position of the first pivotable strut bar,
    wherein the pivot position of the first pivotable strut bar includes a first position in which the first pivotable strut bar is extended and a second position in which the first pivotable strut bar is non-extended, and
    wherein the size of the first gap and the second gap is smaller when the first pivotable strut bar is in the first position than when the first pivotable strut bar is in the second position.

2. The display device of claim 1, wherein a third gap exists between the second supporter and the third supporter and a fourth gap exists between the second supporter and the fourth supporter.

3. The display device of claim 1, wherein the first supporter includes a first coupling groove for coupling the first pivotable strut bar to the first supporter, and the second supporter includes a second coupling groove for coupling the first pivotable strut bar to the second supporter.

4. The display device of claim 3, wherein each of the first coupling groove and the second coupling groove has a first wall, a second wall, and a third wall, and
    wherein the first wall is perpendicular to the second wall and the third wall is tilted with respect to the second wall.

5. The display device of claim 1, wherein the first pivotable strut bar is pivotally connected to middle portions of the first supporter and the second supporter.

6. The display device of claim 5, further comprising:
    a second pivotable strut bar pivotally connected to the first supporter and the second supporter, and
    a third pivotable strut bar pivotally connected to the first supporter and the second supporter.

7. The display device of claim 6, wherein the second pivotable strut bar is pivotally connected to first end portions of the first supporter and the second supporter, and the third pivotable strut bar is pivotally connected to second end portions of the first supporter and the second supporter.

8. The display device of claim 6, wherein the first pivotable strut bar pivots in a first direction, and the second pivotable strut bar and the third pivotable strut bar pivot in a second direction opposite to the first direction.

9. The display device of claim 1, wherein the third supporter and the fourth supporter are fixed to a rear surface of the display panel.

10. The display device of claim 1, wherein as the first pivotable strut bar is pivoted to be extended, the first supporter and the second supporter are moved away from each other.

11. The display device of claim 10, wherein a distance between the first supporter and the second supporter is smaller when the first pivotable strut bar is non-extended than when the first pivotable strut bar is extended.

12. The display device of claim 1, wherein the first pivotable strut bar includes:
    a first arm pivotally connected to the first supporter;
    a second arm pivotally connected to the second supporter; and
    a hinge unit coupling the first arm with the second arm.

13. The display device of claim 12, wherein the hinge unit includes:
    a first gear at an end portion of the first arm;
    a second gear at an end portion of the second arm, the second gear engaged with the first gear; and
    a housing, and
    wherein the first and second gears are mounted in the housing.

14. The display device of claim 13, further comprising:
    a stopper coupled with the housing,
    wherein the stopper is positioned adjacent to the first and second gears, and
    wherein a length of the stopper is greater than a sum of a diameter of the first gear and a diameter of the second gear.

15. The display device of claim 1, further comprising:
    a back cover positioned at a rear of the display panel,
    wherein the back cover is fixed to at least one of the first supporter and the second supporter.

16. The display device of claim 1, wherein the display panel is bent from a front part of the display device to the side parts of the first supporter and the second supporter.

* * * * *